(12) United States Patent
Park et al.

(10) Patent No.: US 11,374,606 B2
(45) Date of Patent: Jun. 28, 2022

(54) ELECTRONIC DEVICE HAVING WATERPROOF STRUCTURE

(71) Applicant: SAMSUNG ELECTRONICS CO., LTD., Suwon-si (KR)

(72) Inventors: Daehyeong Park, Suwon-si (KR); Jongmin Choi, Suwon-si (KR); Byounguk Yoon, Suwon-si (KR); Minsung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/691,954

(22) Filed: Nov. 22, 2019

(65) Prior Publication Data
US 2020/0186183 A1 Jun. 11, 2020

(30) Foreign Application Priority Data
Dec. 6, 2018 (KR) .................. 10-2018-0156241

(51) Int. Cl.
*H04B 1/3888* (2015.01)
*H05K 5/06* (2006.01)
*H04M 1/02* (2006.01)

(52) U.S. Cl.
CPC .......... *H04B 1/3888* (2013.01); *H04M 1/026* (2013.01); *H05K 5/065* (2013.01)

(58) Field of Classification Search
None
See application file for complete search history.

(56) References Cited

U.S. PATENT DOCUMENTS

| 5,252,141 A | * | 10/1993 | Inoue | B32B 17/02 |
| | | | | 136/251 |
| 2003/0223577 A1 | * | 12/2003 | Ono | H04M 1/18 |
| | | | | 379/441 |
| 2008/0015000 A1 | * | 1/2008 | Jung | H04M 1/026 |
| | | | | 455/575.1 |
| 2009/0008885 A1 | * | 1/2009 | Kanagae | C08L 75/04 |
| | | | | 277/650 |
| 2009/0101384 A1 | * | 4/2009 | Kawasaki | H04B 1/3888 |
| | | | | 174/50.5 |

(Continued)

FOREIGN PATENT DOCUMENTS

JP 10-242664 9/1998
JP 2003347756 A * 12/2003

(Continued)

OTHER PUBLICATIONS

International Search Report dated Mar. 3, 2020 in counterpart International Patent Application No. PCT/KR2019/016019.

*Primary Examiner* — Gennadiy Tsvey
(74) *Attorney, Agent, or Firm* — Nixon & Vanderhye P.C.

(57) ABSTRACT

An electronic device is provided, the electronic device including a housing including a side member comprising a side housing comprising a metal material; a display disposed in an inner space of the housing to be viewable through at least a portion of the housing; a mid plate disposed in the inner space and comprising a metal material; a waterproof member comprising an adhesive material disposed between a first portion of the mid plate and a second portion of the side member and facing the first portion; and a coating layer disposed between the first portion and the waterproof member.

13 Claims, 22 Drawing Sheets

(56) References Cited

U.S. PATENT DOCUMENTS

| | | | |
|---|---|---|---|
| 2009/0211057 A1* | 8/2009 | Yamaguchi | E05D 15/48 16/362 |
| 2009/0312058 A9 | 12/2009 | Wood et al. | |
| 2010/0206601 A1* | 8/2010 | Choraku | H04M 1/0249 174/50.5 |
| 2011/0090652 A1* | 4/2011 | Wee | H05K 5/069 361/749 |
| 2011/0115744 A1* | 5/2011 | Murayama | H04M 1/0268 345/174 |
| 2011/0133409 A1* | 6/2011 | Shibuya | B29C 45/1676 277/312 |
| 2012/0238326 A1* | 9/2012 | Mori | H04M 1/0235 455/566 |
| 2013/0088818 A1* | 4/2013 | Yamaguchi | C09J 7/26 361/679.01 |
| 2013/0175910 A1* | 7/2013 | Itou | H04M 1/0249 312/223.1 |
| 2013/0217451 A1 | 8/2013 | Komiyama et al. | |
| 2013/0242477 A1* | 9/2013 | Hattori | H05K 5/061 361/679.01 |
| 2013/0252061 A1* | 9/2013 | Kim | H04M 1/0262 429/100 |
| 2013/0258563 A1* | 10/2013 | Lai | H04M 1/18 361/679.01 |
| 2013/0314863 A1* | 11/2013 | Tanaka | H05K 5/06 361/679.01 |
| 2013/0335211 A1* | 12/2013 | Kobayashi | H04M 1/0266 340/407.2 |
| 2014/0099503 A1* | 4/2014 | Kubo | C09J 7/50 428/353 |
| 2015/0109170 A1* | 4/2015 | Kang | H04M 1/0277 343/702 |
| 2015/0155614 A1* | 6/2015 | Youn | H01Q 1/243 343/702 |
| 2015/0179302 A1* | 6/2015 | Lin | H01B 7/282 174/69 |
| 2017/0013101 A1* | 1/2017 | Chen | H04M 1/18 |
| 2017/0093079 A1 | 3/2017 | Wagman et al. | |
| 2017/0275425 A1* | 9/2017 | Sato | C08G 73/1007 |
| 2017/0344053 A1 | 11/2017 | Kim et al. | |
| 2018/0017995 A1* | 1/2018 | Gable | H01Q 1/22 |
| 2018/0076412 A1* | 3/2018 | Kim | H01L 51/56 |
| 2018/0110143 A1* | 4/2018 | Zhao | G06F 1/1698 |
| 2018/0124939 A1* | 5/2018 | Hung | H04B 1/3888 |
| 2018/0286924 A1* | 10/2018 | Lee | H01L 51/5237 |
| 2019/0268033 A1* | 8/2019 | Cha | H04M 1/0249 |
| 2019/0295788 A1* | 9/2019 | Park | H04M 1/02 |

FOREIGN PATENT DOCUMENTS

| | | | |
|---|---|---|---|
| JP | 2012-095152 | 5/2012 | |
| JP | 2015092644 A * | 5/2015 | H04M 1/0266 |
| WO | 2016/017075 | 2/2016 | |

* cited by examiner

ELECTRONIC DEVICE HAVING WATERPROOF STRUCTURE

CROSS-REFERENCE TO RELATED APPLICATION

This application is based on and claims priority under 35 U.S.C. § 119 to Korean Patent Application No. 10-2018-0156241, filed on Dec. 6, 2018, in the Korean Intellectual Property Office, the disclosure of which is incorporated by reference herein in its entirety.

BACKGROUND

Field

The disclosure relates to an electronic device including a waterproof structure.

Description of Related Art

Electronic devices may include various electronic components arranged together. The electronic device may have an external shape firmly designed to protect various electronic components therein and include a waterproof structure for blocking moisture and foreign materials from being introduced therein.

Gaps between a front plate, mid plate, and rear plate of the electronic device may be coupled by an adhesive member such as a tape. Adhesive members such as the tape may perform a waterproof function as well as coupling between the front plate, the mid plate, and the rear plate. When the electronic device is disassembled for repair or the like, the adhesive member may be damaged in a disassembling process, and reuse of the adhesive member may be difficult. When the adhesive member is damaged, it is necessary to replace the adhesive member, but it is difficult to replace only the adhesive member by hand; thus, a work of replacing an entire component including the adhesive member may occur, whereby a cost may increase unnecessarily.

SUMMARY

Embodiments of the disclosure may provide an electronic device having a waterproof structure that can perform a waterproofing function without being damaged in a disassembling process of the electronic device.

In accordance with an example aspect of the disclosure, an electronic device includes a housing including a side housing comprising a metal material; a display disposed in an inner space of the housing to be viewable through at least a portion of the housing; a mid plate disposed in the inner space and comprising a metal material; a waterproof member comprising an adhesive material disposed between a first portion of the mid plate and a second portion of the side housing and facing the first portion; and a coating layer disposed between the first portion and the waterproof member.

In accordance with another example aspect of the disclosure, an electronic device includes a housing including a front plate facing in a first direction, a rear plate facing in a second direction opposite the first direction, and a side member comprising a side housing enclosing a space between the front plate and the rear plate; a display disposed in the space and disposed to be viewable through the front plate; a mid plate positioned between the display and the rear plate; and a waterproof member comprising an adhesive material disposed between a first portion of the mid plate and a second portion of the side member and facing the first portion, wherein the waterproof member has a bonding force with the second portion greater than a bonding force with the first portion.

BRIEF DESCRIPTION OF THE DRAWINGS

The above and other aspects, features and advantages of certain embodiments of the present disclosure will be more apparent from the following detailed description, taken together with the accompanying drawings, in which.

DETAILED DESCRIPTION

Hereinafter, various example embodiments of the present disclosure are described in greater detail with reference to accompanying drawings.

Figure 1:
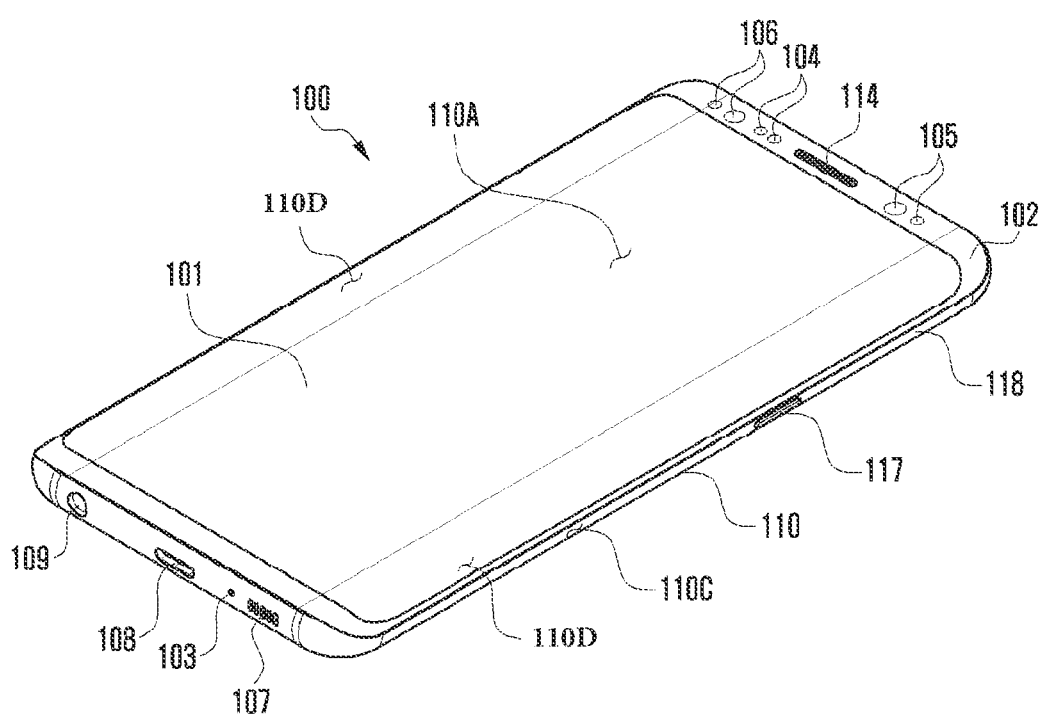
FIG. 1 is a front perspective view of an example mobile electronic device according to an embodiment.
Figure 2:
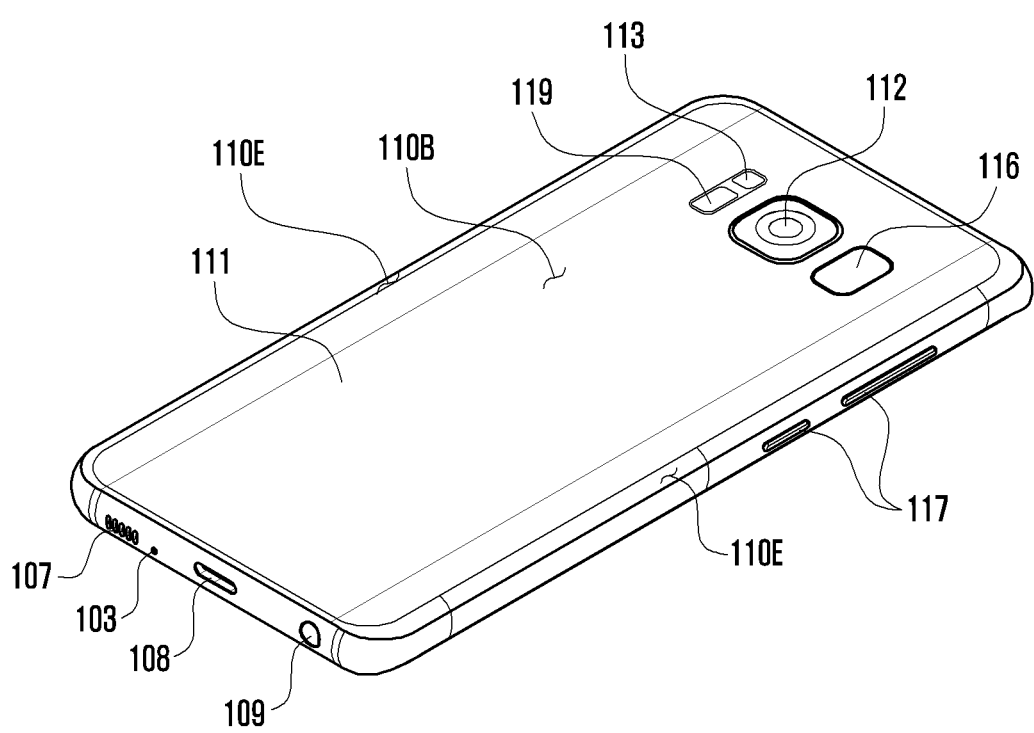
FIG. 2 is a rear perspective view illustrating the electronic device of FIG. 1 according to an embodiment.

FIG. 1 is a front perspective view illustrating an example mobile electronic device 100 according to an embodiment, and FIG. 2 is a rear perspective view illustrating the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104, 116 and 119, camera modules 105, 112 and 113, a key input device 117, a light emitting device 106, and connector holes 108 and 109. The mobile electronic device 100 may omit at least one (e.g., the key input device 117 or the light emitting device 106) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (e.g., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device 106. At least one of the audio module 114, the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and may, for example, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include, for example, and without limitation, at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, an illuminance sensor, or the like.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device 106 may be disposed on the first surface 110A of the housing 110. For example, the light emitting device 106 may provide status information of the electronic device 100 in an optical form. The light emitting device 106 may provide a light source associated with the operation of the camera module 105. The light emitting device 106 may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Figure 3:
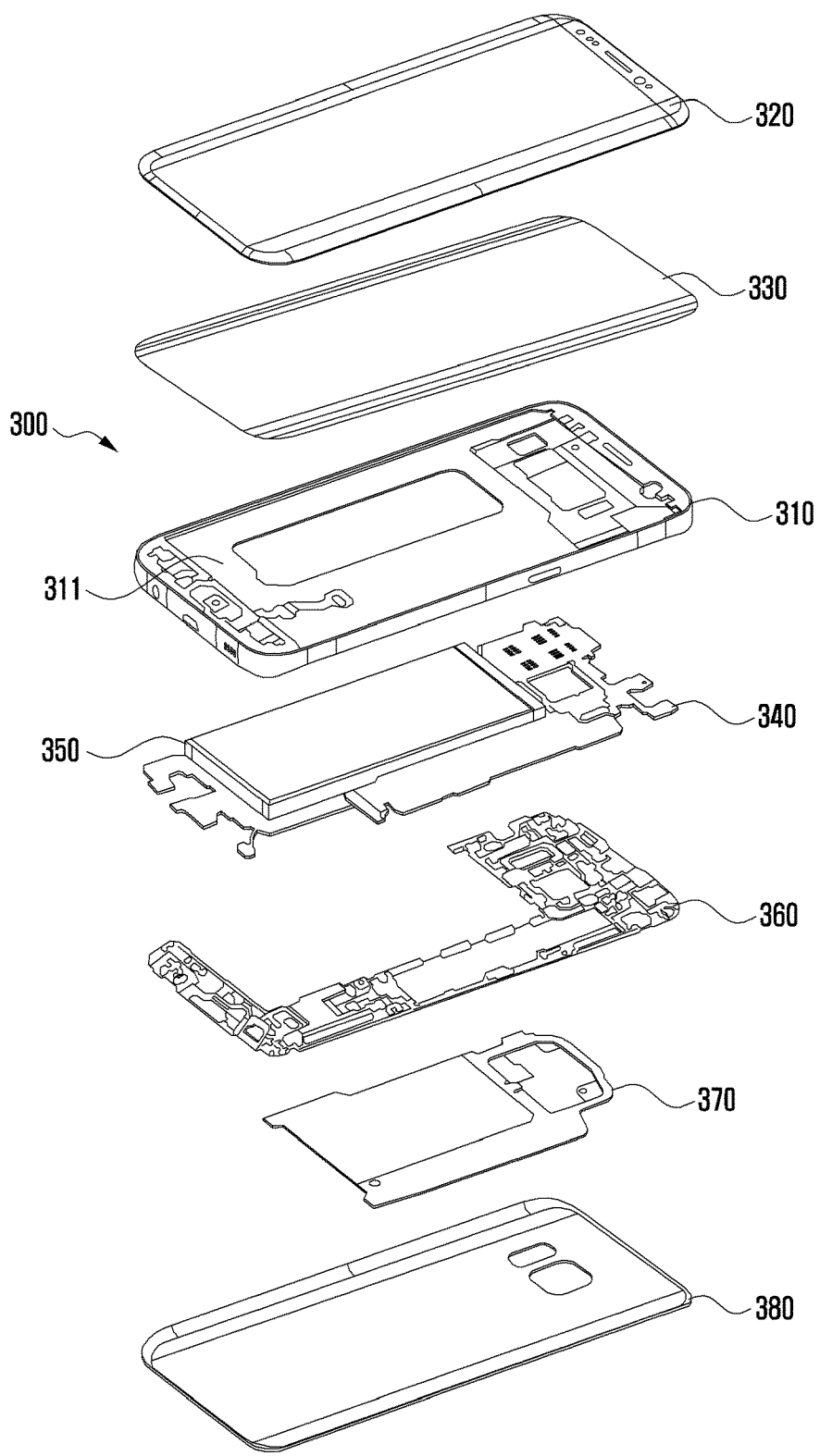
FIG. 3 is an exploded perspective view illustrating the electronic device of FIG. 1 according to an embodiment.

FIG. 3 is an exploded perspective view illustrating the mobile electronic device 300 shown in FIG. 1.

Referring to FIG. 3, the mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof may not be repeated below.

The first support member 311 is disposed inside the mobile electronic device 300 and may be connected to, or integrated with, the lateral bezel structure 310. The first support member 311 may include, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include various processing circuitry, such as, for example, and without limitation, one or more of a central processing unit (CPU), an application processor (AP), a graphics processing unit (GPU), an image signal processor (ISP), a sensor hub processor, a communications processor (CP), or the like.

The memory may include, for example, volatile memory and/or non-volatile memory.

The interface may include, for example, and without limitation, a high definition multimedia interface (HDMI), a USB interface, a secure digital (SD) card interface, and/or an audio interface, or the like. The interface may electrically or physically connect the mobile electronic device 300 with an external electronic device and may include a USB connector, an SD card/multimedia card (MMC) connector, or an audio connector.

The battery 350 may, for example, be a device for supplying power to at least one component of the mobile electronic device 300, and may include, for example, and without limitation, a non-rechargeable primary battery, a rechargeable secondary battery, a fuel cell, or the like. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, and without limitation, a near field communication (NFC) antenna, a wireless charging antenna, and/or a magnetic secure transmission (MST) antenna, or the like. The antenna 370 may perform short-range communication with an external device, or transmit and receive power required for charging wirelessly. An antenna structure may be formed by a part or combination of the lateral bezel structure 310 and/or the first support member 311.

Figure 4A:
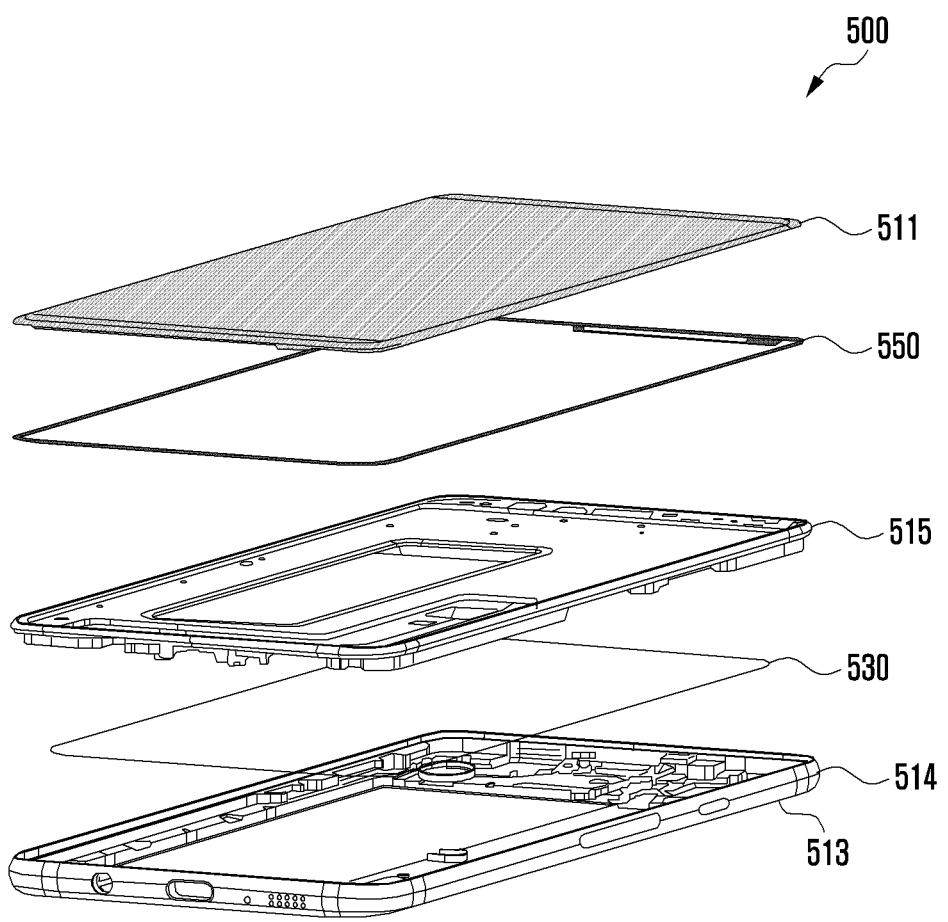
FIGS. 4A, 4B and 4C are exploded perspective views illustrating an example electronic device according to various embodiments of the disclosure.
Figure 4B:
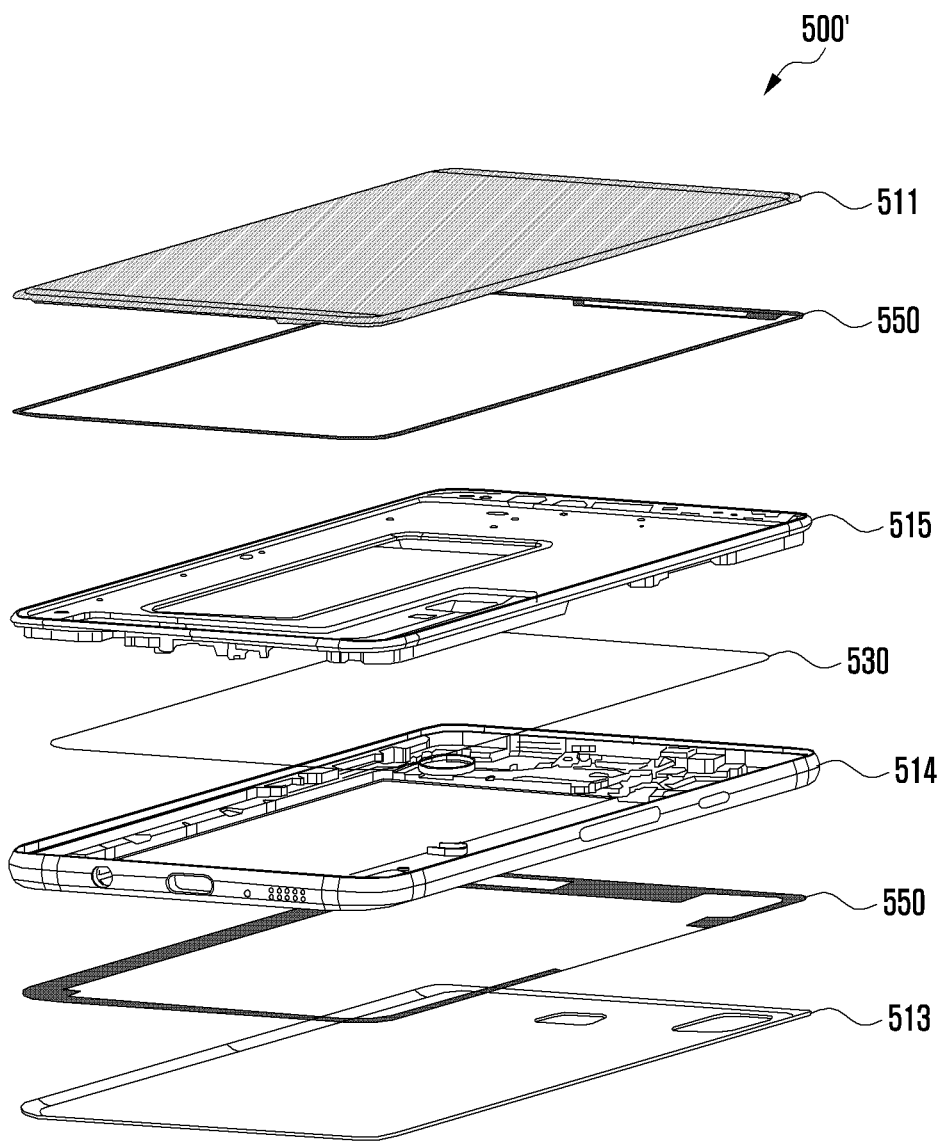
Figure 4C:
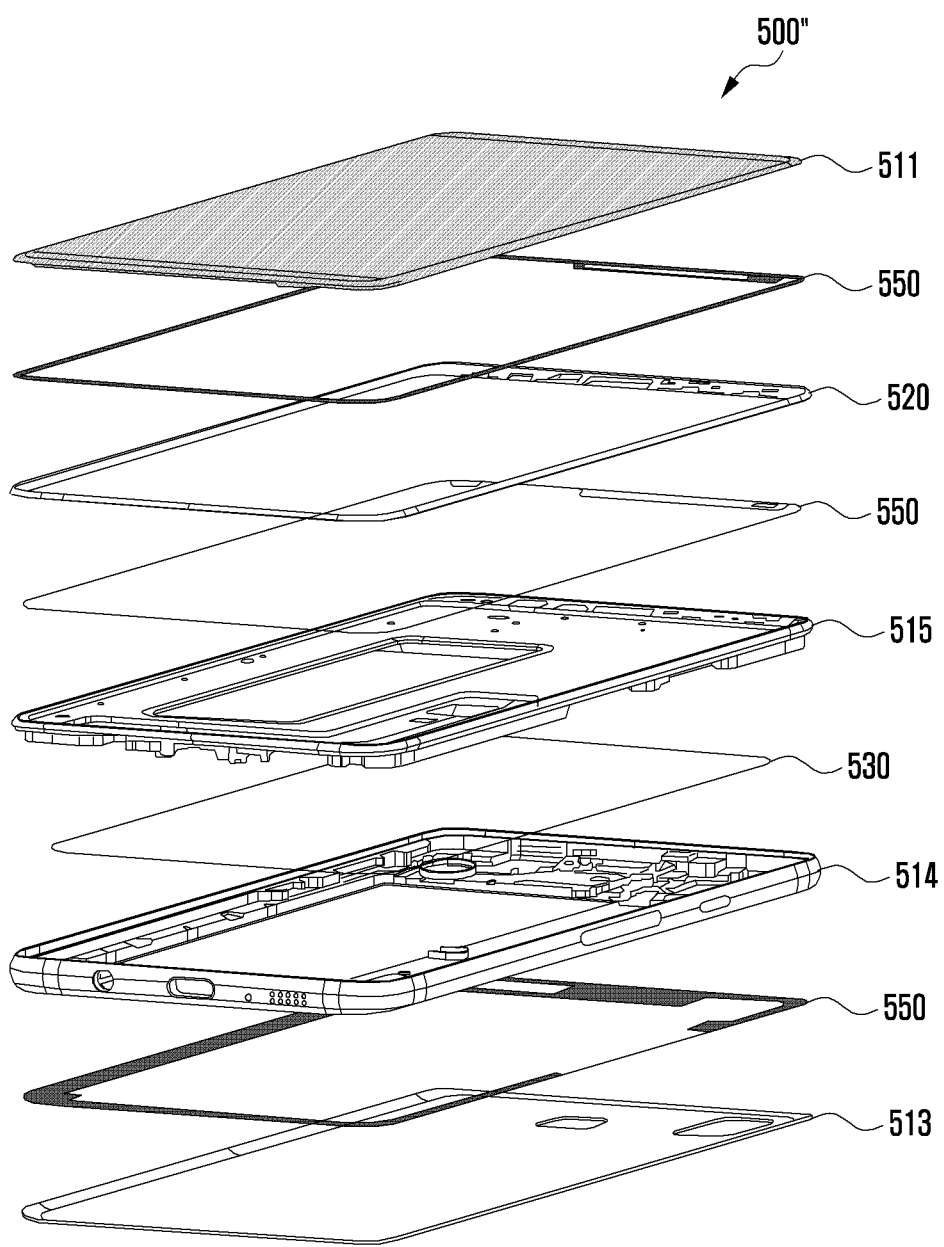

FIGS. 4A, 4B and 4C are exploded perspective views illustrating example electronic devices 500, 500', and 500" according to various embodiments of the disclosure.

As illustrated in FIG. 4A, an electronic device 500 according to an embodiment of the disclosure may include a front plate 511 and a rear plate 513 in which an adhesive member 550, mid plate 515, waterproof member 530, and side member 514 are integrally formed.

The front plate 511 according to an example embodiment of the disclosure may refer, for example, to a window layer disposed to face a first direction, and a display may be viewed through the front plate 511. The rear plate 513 may be disposed to face in a second direction opposite the first direction of the front plate 511 and be disposed substantially parallel to the front plate 511. The side member 514 may include a wall or housing portion to enclose a space between the front plate 511 and the rear plate 513 and be integrally formed with the rear plate 513, and some areas thereof may overlap along an outer edge of the mid plate 515. The mid plate 515 may be disposed at a space between the front plate 511 and the rear plate 513, and one surface thereof may seal a space between the front plate 511 and the mid plate 515 while being coupled through the front plate 511 and the adhesive member 550. The other surface thereof may be overlapped in some areas with the side member 514 and be coupled to the side member 514 and be sealed through the waterproof member 530 disposed between the mid plate 515 and the side member 514.

As illustrated in FIG. 4B, the electronic device 500' according to another example embodiment of the disclosure may include a front plate 511, adhesive member 550, mid plate 515, waterproof member 530, side member (e.g., side housing) 514, and a rear plate 513.

The front plate 511 according to an embodiment of the disclosure may refer, for example, to a window layer disposed to face a first direction, and a display may be viewed through the front plate 511. The rear plate 513 may be disposed to face a second direction opposite the first direction of the front plate 511 and be disposed substantially parallel to the front plate 511. The side member (e.g., side housing) 514 may enclose a space of the front plate 511 and the rear plate 513 and be formed separately from the rear plate 513, and the side member 514 and the rear plate 513 may seal a space between the side member 514 and the rear plate 513 while being coupled through the adhesive member 550.

The side member 514 according to an example embodiment of the disclosure may overlap with some regions along an outer edge of the mid plate 515. The mid plate 515 may be disposed in a space between the front plate 511 and the rear plate 513, and one surface thereof may seal a space between the front plate 511 and the mid plate 515 while being coupled through the front plate 511 and the adhesive member 550. The other surface may overlap in some areas with the side member 514 and be coupled to the side member 514 and be sealed through the waterproof member 530 disposed between the mid plate 515 and the side member 514.

As illustrated in FIG. 4C, the electronic device 500" according to another example embodiment of the disclosure may include a front plate 511, adhesive member 550, front deco 520, mid plate 515, waterproof member 530, side member 514, and rear plate 513.

FIG. 4C is different from the above-described examples of FIGS. 4A and 4B in that the front deco 520 layer is further added between the front plate 511 and the mid plate 515 and the remaining portions may be the same as or similar to FIGS. 4A and 4B.

Figure 5:
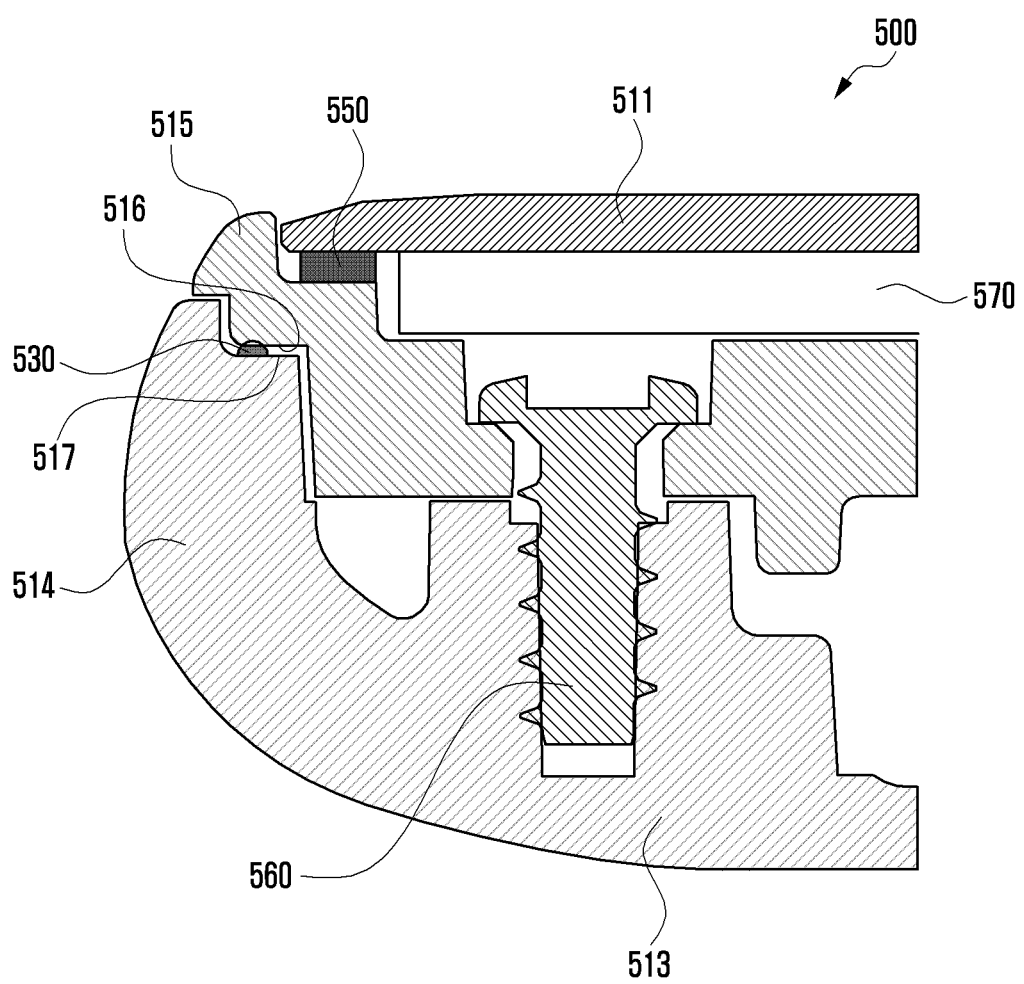
FIG. 5 is a cross-sectional view illustrating an example electronic device according to an embodiment of the disclosure.

FIG. 5 is a cross-sectional view illustrating an example electronic device 500 according to an embodiment of the disclosure.

When describing a cross-section of the electronic device 500 according to an embodiment of the disclosure, as illustrated in FIG. 4A, it is described based on an example in which a side member 514 and a rear plate 513 are integrally formed, but the disclosure is not limited thereto and may be equally applied to the electronic device 500 of FIGS. 4B and 4C.

When describing the electronic device 500 according to an example embodiment of the disclosure with reference to the cross-section of FIG. 5, the mid plate 515 may be stacked on the rear plate 513, and the front plate 511 may be stacked on the mid plate 515. While the front plate 511 and the mid plate 515 are coupled by the adhesive member 550 such as, for example, a tape, a space therebetween may be sealed by the adhesive member 550. A display 570 may be disposed between the front plate 511 and the mid plate 515. The display 570 may be disposed by being coupled to the front plate 511, but the disclosure is not limited thereto and the display 570 may be coupled to the mid plate 515 or may be disposed in a space between the front plate 511 and the mid plate 515 without being coupled to either the front plate 511 or the mid plate 515, as needed.

When describing coupling between the mid plate 515 and the rear plate 513 according to an example embodiment of the disclosure, the mid plate 515 and the side member 514 integrally formed with the rear plate 513 may be in contact with each other in a predetermined portion, and the watertight (e.g., waterproof) member 530 may be disposed at the contact portion to seal a space between the side member 514 and the mid plate 515. The contact portion may be an outer portion of the mid plate 515 and be in contact with the side member 514, and the mid plate 515 and may be referred to as a first portion 516, and the side member 514 side may be referred to as a second portion 517. The first portion 516 and the second portion 517 may, for example, form a closed curve.

The waterproof member 530 according to an example embodiment of the disclosure may provide differently adhesive forces between a portion contacting the first portion 516 and a portion contacting the second portion 517. The waterproof member 530 may have a stronger adhesive force to adhere to the second portion 517 than to the first portion 516. Thereby, in a process of separating the mid plate 515, the waterproof member 530 may be adhered to the mid plate 515 to be separated together, or in a process of separating the mid plate 515, the waterproof member 530 may be prevented from or avoid being damaged and remain while maintaining a shape in the second portion 517. For example, the waterproof member 530 may remain irregularly partially in the mid plate 515, or the waterproof member 530 may be peeled off and be damaged. The mid plate 515 and the rear plate 513 according to an embodiment of the disclosure may be physically fastened. For example, as illustrated in FIG. 5, by coupling using a screw 560, a sealing performance between the first portion 516 and the waterproof member 530 may be improved.

The waterproof member 530 according to an embodiment of the disclosure may be made of a material having elasticity such as, for example, and without limitation, silicone and urethane foam. When the mid plate 515 and the rear plate 513 are coupled through a screw, while the waterproof member 530 having elasticity is compressed and transformed, a sealing performance between the first portion 516 and the waterproof member 530 may be improved.

Figure 6A:
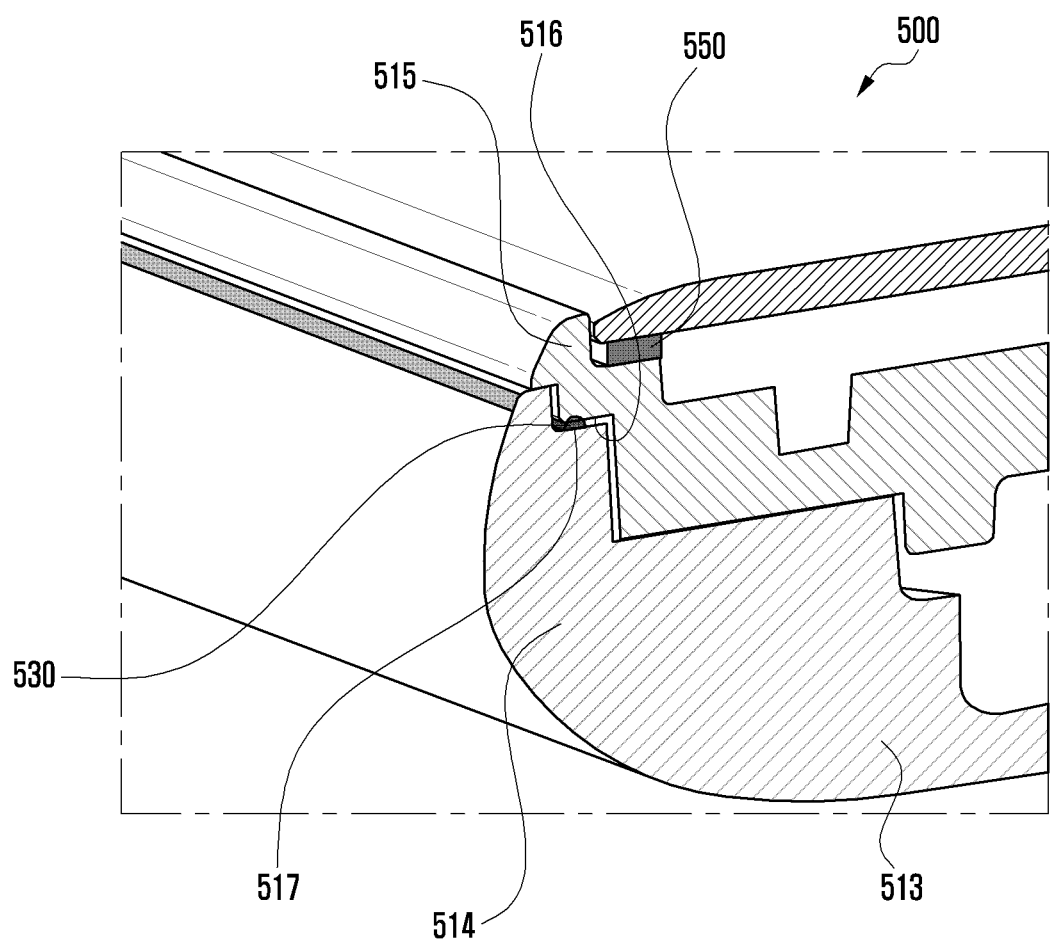
FIGS. 6A, 6B and 6C are enlarged sectional views illustrating a cross section and an example waterproof member of an example electronic device according to an embodiment of the disclosure.
Figure 6B:
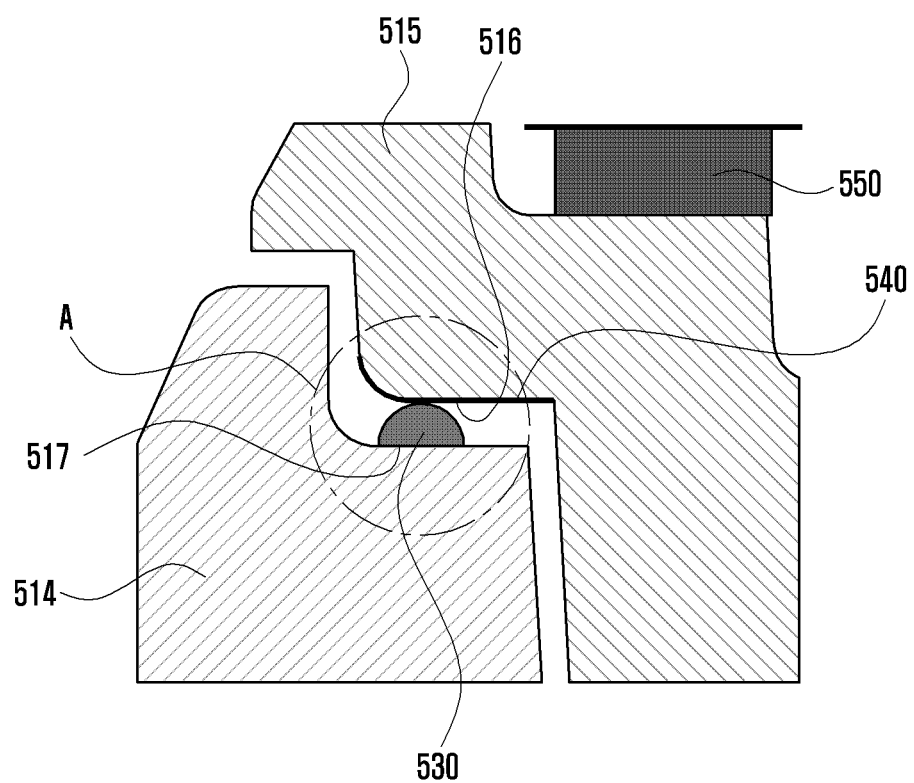
Figure 6C:
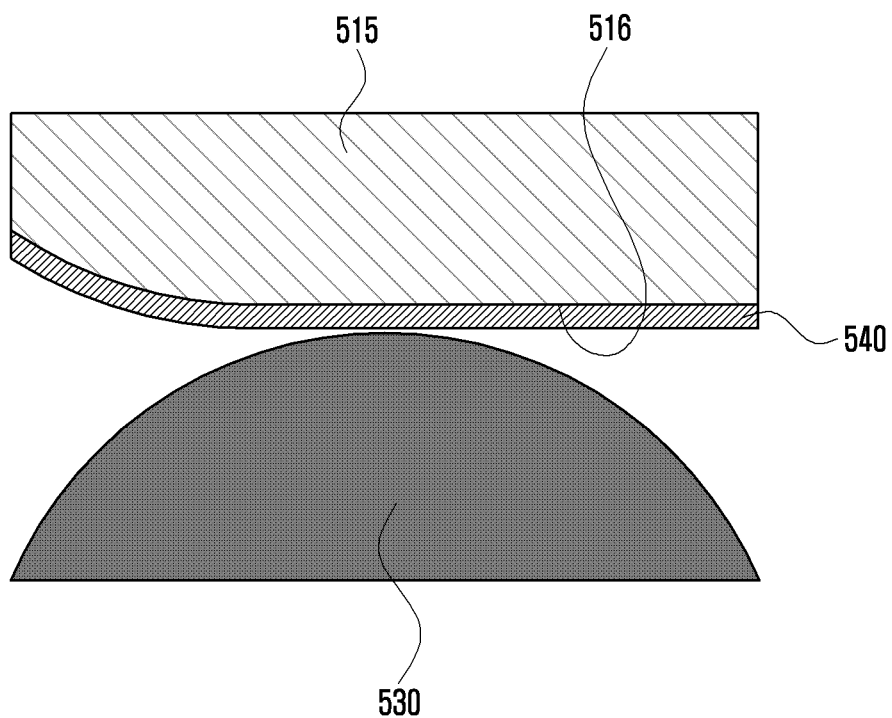

FIGS. 6A, 6B and 6C are enlarged sectional views illustrating a cross section and a waterproof member 530 of an example electronic device 500 according to an embodiment of the disclosure.

FIG. 6A is a cross-sectional view illustrating an electronic device 500 according to an embodiment of the disclosure, FIG. 6B is diagram illustrating a first portion 516 of the mid plate 515 and a second portion 517 of the side member 514, and FIG. 6C is an enlarged view of a portion A of FIG. 6B.

With reference to FIGS. 6B and 6C, the waterproof member 530 is disposed along the second portion 517 of the side member 514; thus, the waterproof member 530 and the second portion 517 directly contact each other, and by forming the coating layer 540 in the first portion 516 of the mid plate 515, the coating layer 540 and the waterproof member 530 may contact each other.

The coating layer 540 according to an example embodiment of the disclosure may be configured, for example, and without limitation, with at least one of a silicone release agent, a fluorine resin, Teflon, or the like, to lower surface energy or surface tension. Thereby, by weakening a bonding force between the first portion 516 and the waterproof member 530, a bonding force between the second portion 517 and the waterproof member 530 may be stronger than that between the first portion 516 and the waterproof member 530. In describing the coating layer 540 according to an embodiment of the disclosure, a description is provided by way of example in which a separate layer such as a separate silicon release agent, a fluororesin, or Teflon is formed in the first portion 516, but the disclosure is not limited thereto and may include a case of a surface treatment of lowering surface energy of the first portion 516.

It may be preferable that the second portion 517 of the side member 514 according to the embodiment of the disclosure is formed to have higher surface energy than that of the first portion 516. For example, by performing a plasma treatment of a surface of the second portion 517, surface energy of the second portion 517 increases, and by increasing a bonding force between the second portion 517 and the waterproof member 530, a bonding force of the second portion 517 and the waterproof member 530 may be stronger than that of the first portion 516 and the waterproof member 530. The second portion 517 of the side member 514 according to an embodiment of the disclosure may have higher surface energy than that of an area of the remaining side member 514, except for the second portion 517. For example, by performing a plasma treatment on a surface of only the second portion 517, surface energy of the second portion 517 may be increased.

The coating layer 540 according to an embodiment of the disclosure is illustrated in FIGS. 6A, 6B and 6C, but it may be applied to various embodiments according to FIGS. 7A, 7B, 8A, 8B, 9A, 9B, 10A, 10B and 11 to be described in greater detail below.

Figure 7A:
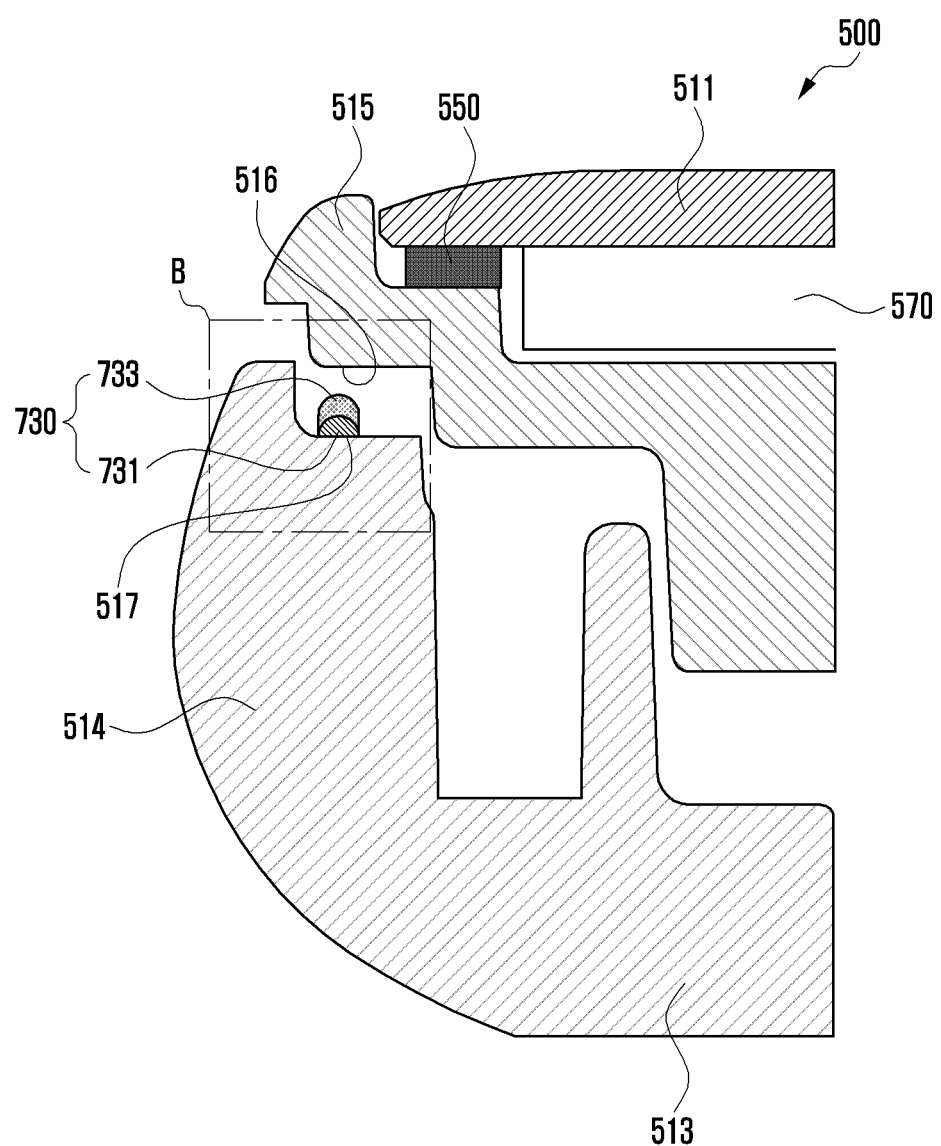
FIGS. 7A and 7B are enlarged sectional views illustrating an example waterproof member having a double layer according to another embodiment of the disclosure.
Figure 7B:
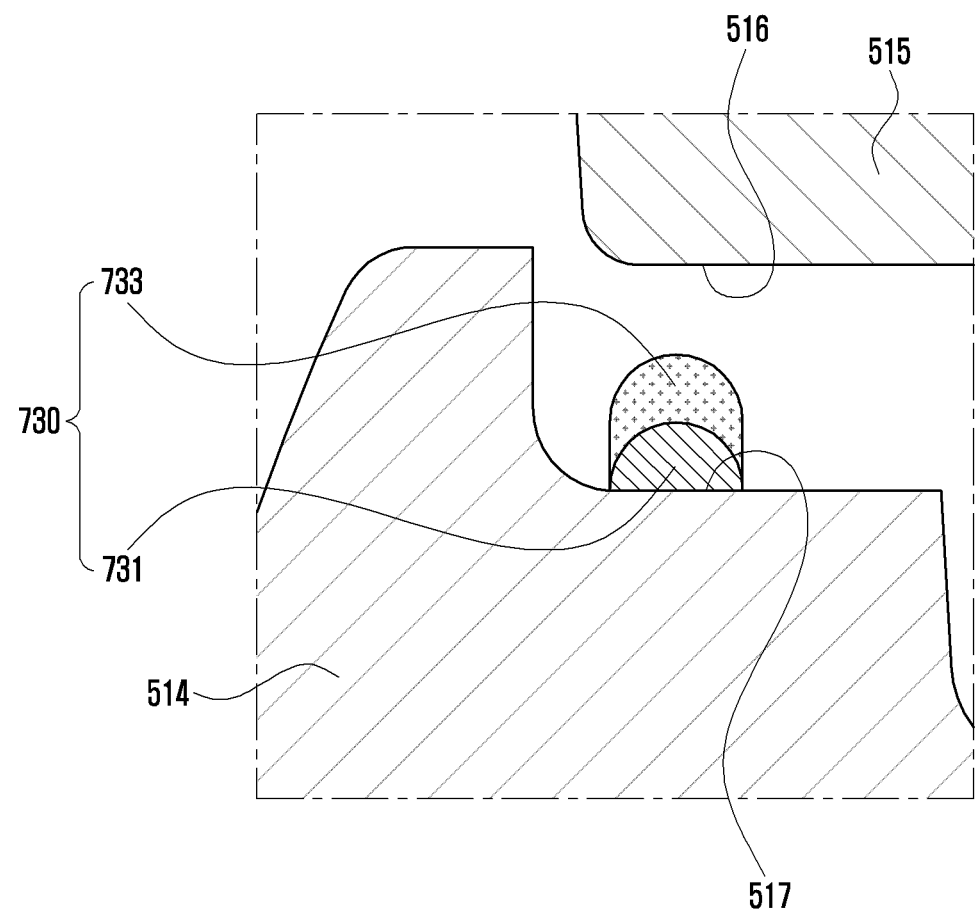

FIGS. 7A and 7B are enlarged sectional views illustrating a cross section and a waterproof member 730 of an example electronic device 500 according to another embodiment of the disclosure.

FIG. 7A is a diagram illustrating a first portion 516 of the mid plate 515 and a second portion 517 of the side member 514, and FIG. 7B is an enlarged view illustrating a portion B of FIG. 7A.

With reference to FIGS. 7A and 7B, the waterproof member 730 may include a first material layer 731 including a first material and a second material layer 733 including a second material.

The first material according to an embodiment of the disclosure may, for example, be in the form of a solution, have a characteristic of high interfacial adhesion, and be applied along the second portion 517 of the side member 514. When the first material is applied and cured, a first material layer 731 may be formed, and a second material may be stacked and applied along the first material layer 731. The second material may, for example, be in the form of a solution, and when the second material is cured with a material having interfacial adhesion relatively lower than that of the first material, a second material layer 733 may be formed.

The first material layer 731 according to an example embodiment of the disclosure may contact the second portion 517 of the side member 514, and the second material layer 733 may contact the first portion 516 of the mid plate 515. As the second material layer 733 made of a material having low interfacial adhesion contacts the first portion 516, a bonding force between the second portion 517 and the waterproof member 730 may be stronger than that between the first portion 516 and the waterproof member 730.

By performing a processing treatment of a surface of the first portion 516, the first portion 516 may have surface energy lower than that of the remaining portions of the mid plate 515. An adhesive force of the second material layer 733 and the first portion 516 of the mid plate 515 may be further lowered.

Figure 8A:
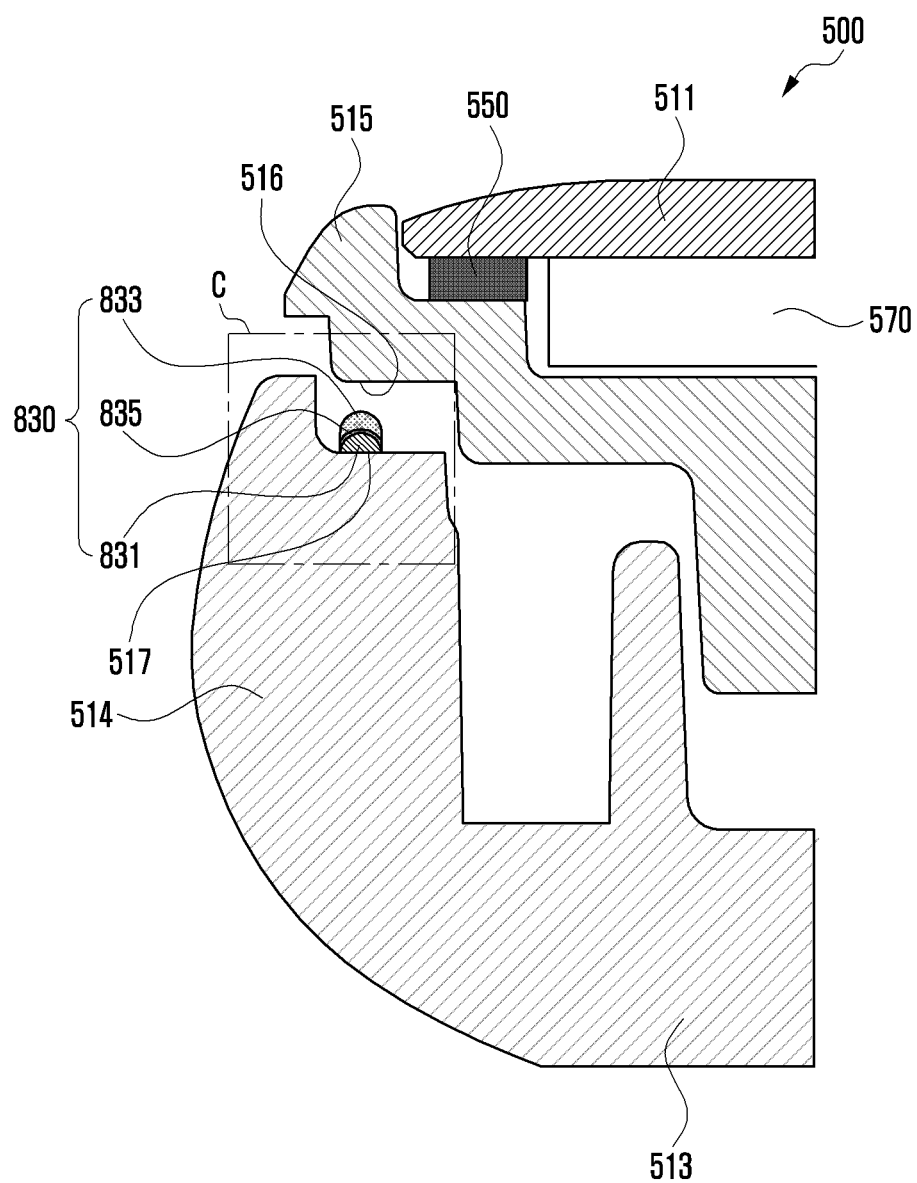
FIGS. 8A and 8B are enlarged sectional views illustrating an example waterproof member having a triple layer according to another embodiment of the disclosure.
Figure 8B:
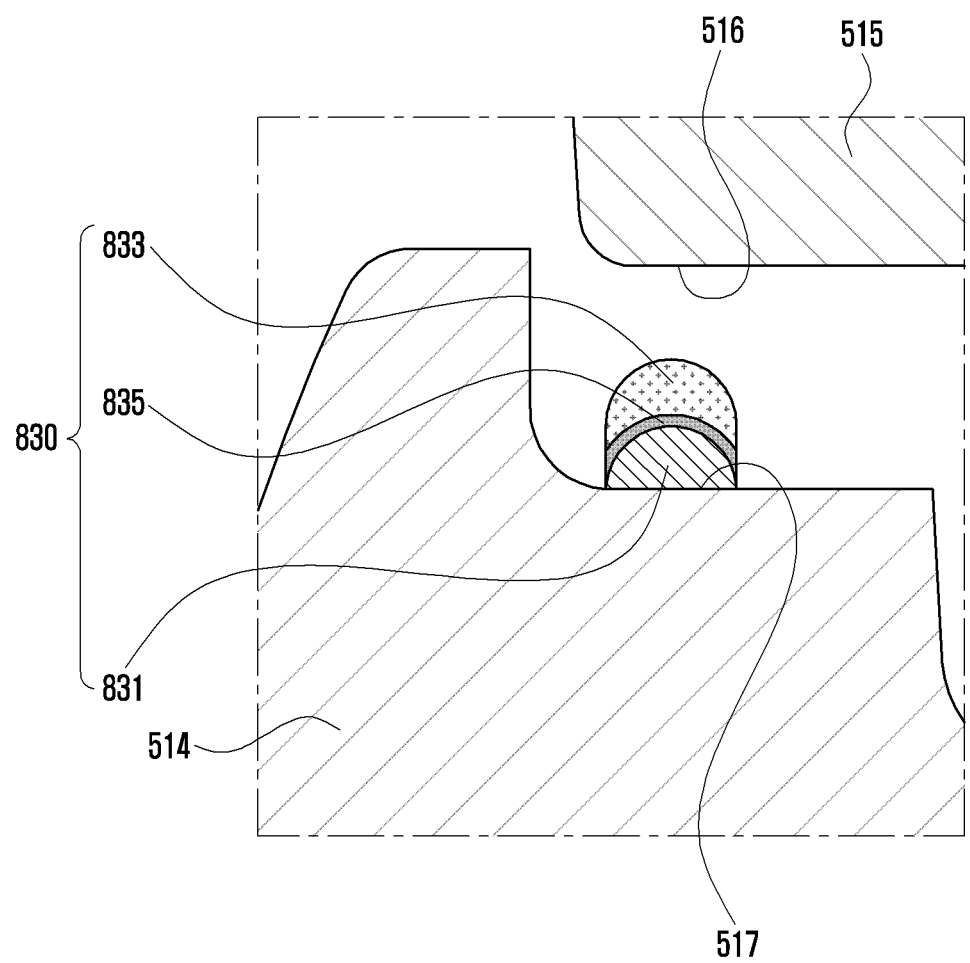

FIGS. 8A and 8B are enlarged sectional views illustrating a cross section and a waterproof member 830 of an electronic device 500 according to another embodiment of the disclosure.

FIG. 8A is a view illustrating the first portion 516 of the mid plate 515 and the second portion 517 of the side member 514, and FIG. 8B is an enlarged view illustrating a portion C of FIG. 8A.

With reference to FIGS. 8A and 8B, a waterproof member 830 may include a first material layer 831 including a first material and a second material layer 833 and third material layer 835 including a second material.

The first material according to an example embodiment of the disclosure may be a material having a characteristic of high interfacial adhesion and be applied along the second portion 517 of the side member 514. When the first material is applied and cured, the first material layer 831 may be formed and a third material may be stacked and applied along the first material layer 831. When the third material is cured, a third material layer 835 may be formed and a second material may be applied along the third material layer 835. When the second material is cured by a material having relatively lower interfacial adhesion than that of the first material, the second material layer 833 may be formed.

Compared with the embodiment of FIGS. 7A and 7B, a bonding force between the first material layer 831 and the second material layer 833, and the first portion 516 and the second portion 517 may be the same or similar, but as the third material layer 835 may be additionally disposed, the first material layer 831 and the second material layer 833 may be prevented from or avoid being peeled off. The third material may enhance an adhesive force between the first material layer 831 and the second material layer 833.

Figure 9A:
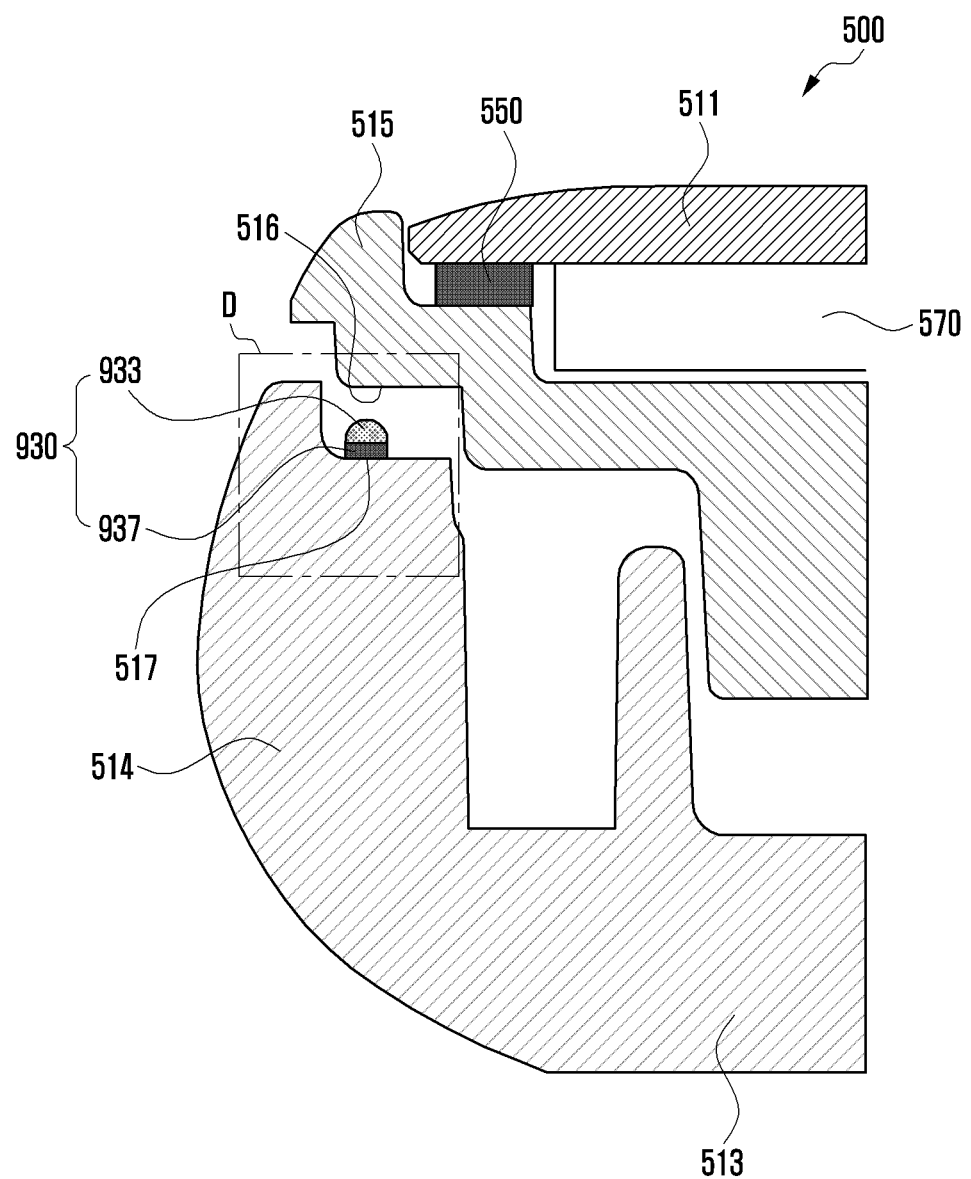
FIGS. 9A and 9B are enlarged sectional views illustrating an example waterproof member having a dual layer including an adhesive layer according to another embodiment of the disclosure.
Figure 9B:
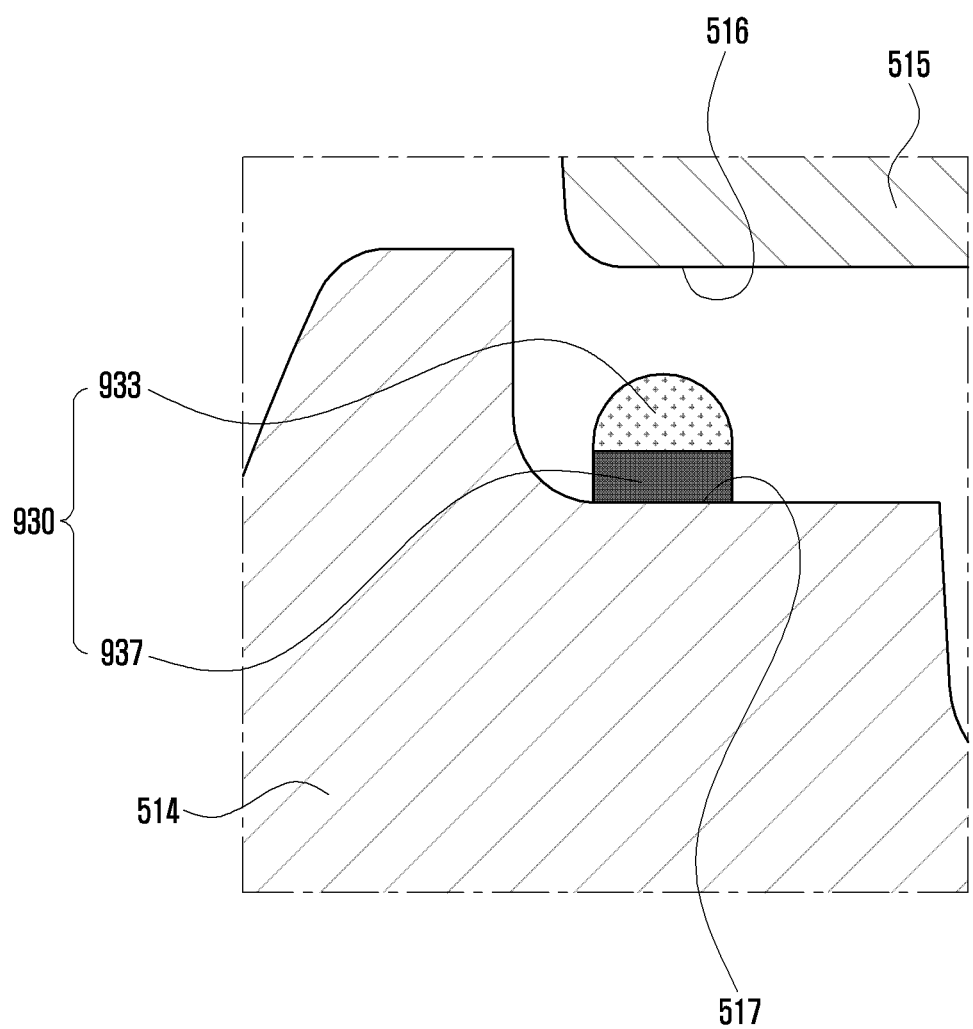

FIGS. 9A and 9B are enlarged sectional views illustrating a cross section and a waterproof member 930 of an electronic device 500 according to another embodiment of the disclosure.

FIG. 9A is a view illustrating the first portion 516 of the mid plate 515 and the second portion 517 of the side member 514, and FIG. 9B is an enlarged view illustrating a portion D of FIG. 9A.

With reference to FIGS. 9A and 9B, the waterproof member 930 may include an adhesive layer 937 and a second material layer 933 including a second material.

The adhesive layer 937 according to an embodiment of the disclosure may have a characteristic of high interfacial adhesion and be disposed along the second portion 517 of the side member 514. For example, the adhesive layer 937 may be a tape, but is not limited thereto. The tape may have a form in which an adhesive material is applied on a base of a polyethylene terephthalate (PET) material. The adhesive material may be bonded to the second portion 517, and the second material may be stacked on the base. The second material may be a material having interfacial adhesion relatively lower than that of the adhesive layer 937, and when the second material is cured, the second material layer 933 may be formed.

An adhesive material of the adhesive layer 937 according to an example embodiment of the disclosure may contact the second portion 517 of the side member 514, and the second material layer 933 may contact the first portion 516 of the mid plate 515. The second material layer 933 made of a material having low interfacial adhesion may contact the first portion 516 to enable a bonding force between the second portion 517 and the waterproof member 930 to be relatively stronger than that of the first portion 516 and the waterproof member 930.

Figure 10A:
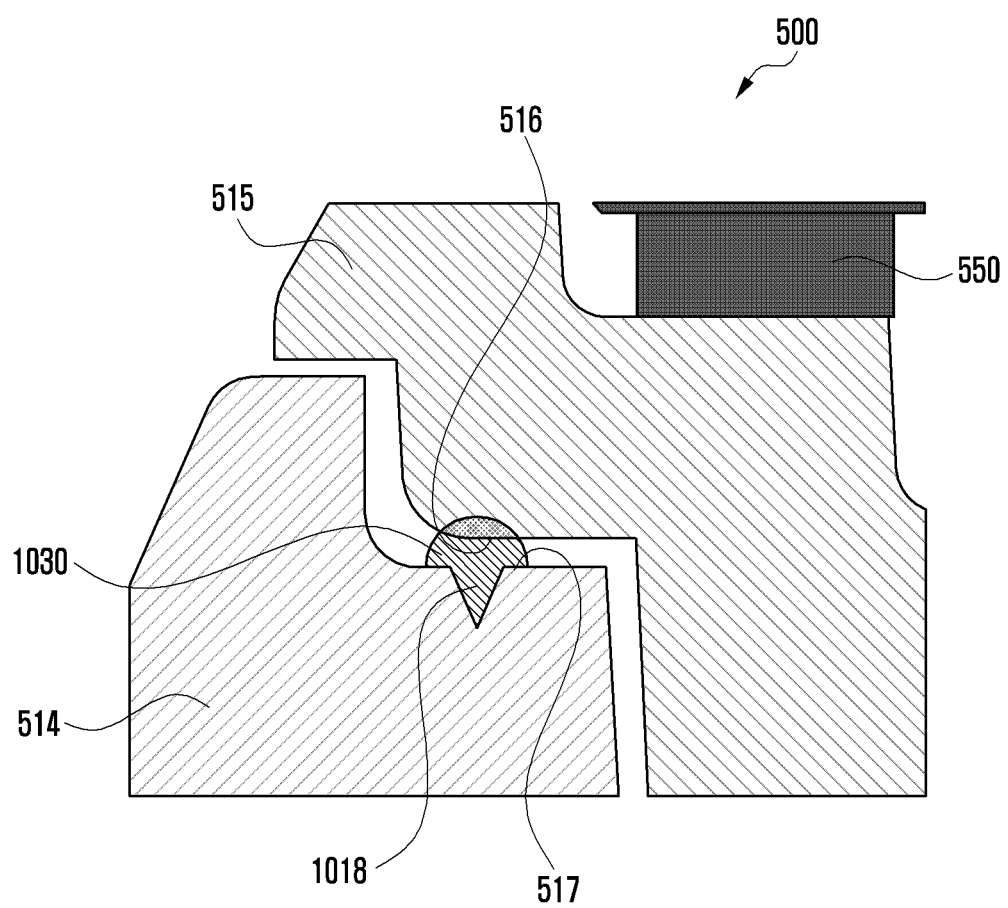
FIGS. 10A and 10B are enlarged sectional views illustrating a cross section and an example waterproof member of an example electronic device having a transformed side member according to another embodiment of the disclosure.
Figure 10B:
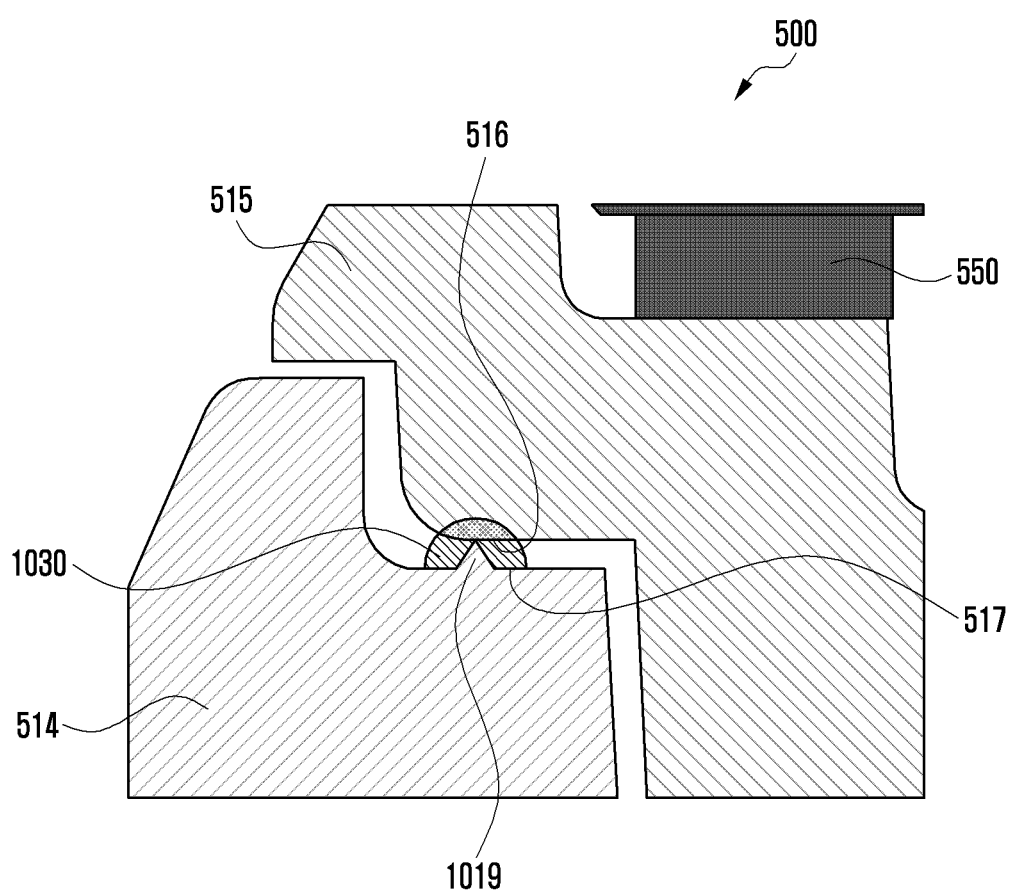

FIGS. 10A and 10B are enlarged sectional views illustrating a cross section and a waterproof member 1030 of an electronic device 500 according to another embodiment of the disclosure.

For example, uneven portions may be formed along the second portion 517, such as, for example, a groove 1018 (FIG. 10A) or a protrusion 1019 (FIG. 10B), and the waterproof member 1030 may be applied along a position of the groove 1018 or the protrusion 1019. By increasing a contact area between the second portion 517 and the waterproof member 1030, a bonding force between the second portion 517 and the waterproof member 1030 is improved, and a bonding force with the second portion 517 rather than the first portion 516 may be formed largely.

Figure 11:
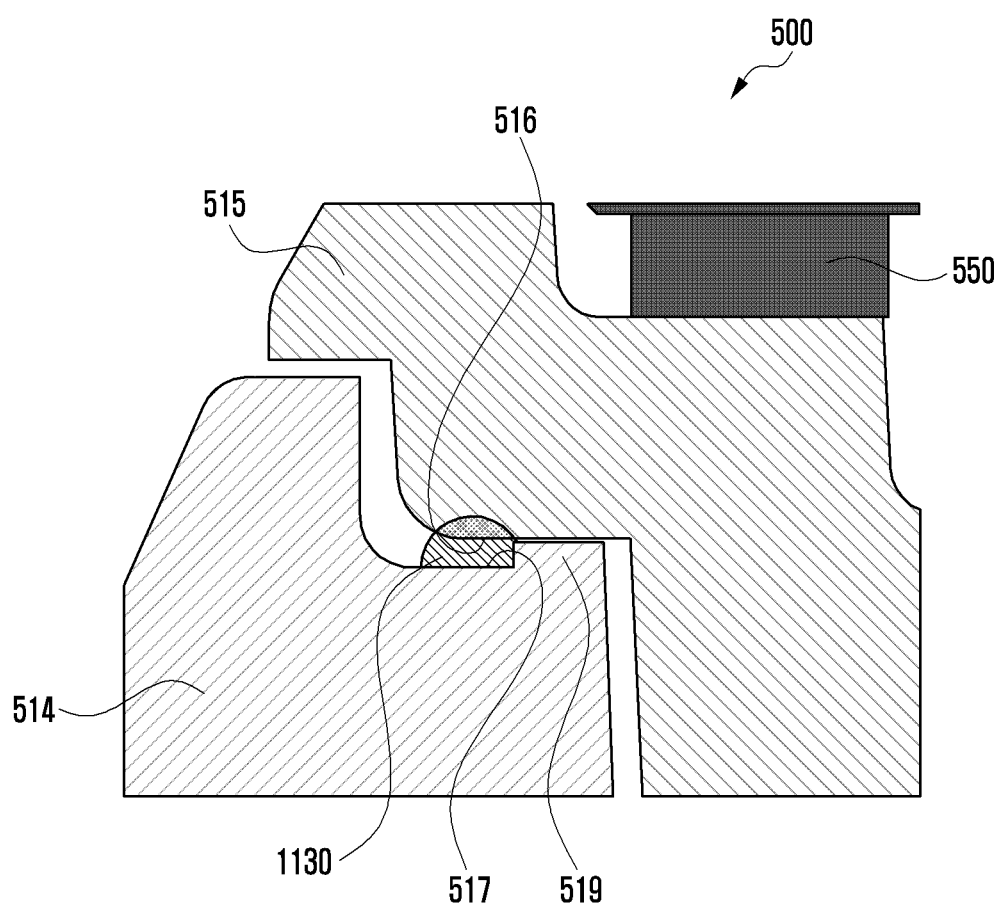
FIG. 11 is an enlarged sectional view illustrating a cross section and an example waterproof member of an example electronic device having a transformed side member according to another embodiment of the disclosure.

FIG. 11 is an enlarged sectional view illustrating a cross section and a waterproof member 1130 of an electronic device 500 according to another embodiment of the disclosure.

For example, in the second portion 517, a latch jaw 519 may be formed along an edge of a direction toward the center of the rear plate 513. By enlarging a contact area of the waterproof member 1130 as much as (e.g., as far as) the latch jaw 519, a bonding force between the second portion 517 and the waterproof member 1130 may be improved, and a bonding force with the second portion 517 may be greater than the bonding force with first portion 516. Further, the latch jaw 519 may prevent and/or reduce an excessive pressure from being applied to the waterproof member 1130 in a process of coupling the mid plate 515 and the rear plate 514, and the latch jaw 519 may prevent and/or avoid the waterproof member 1130 from being peeled toward the side.

Figure 12:
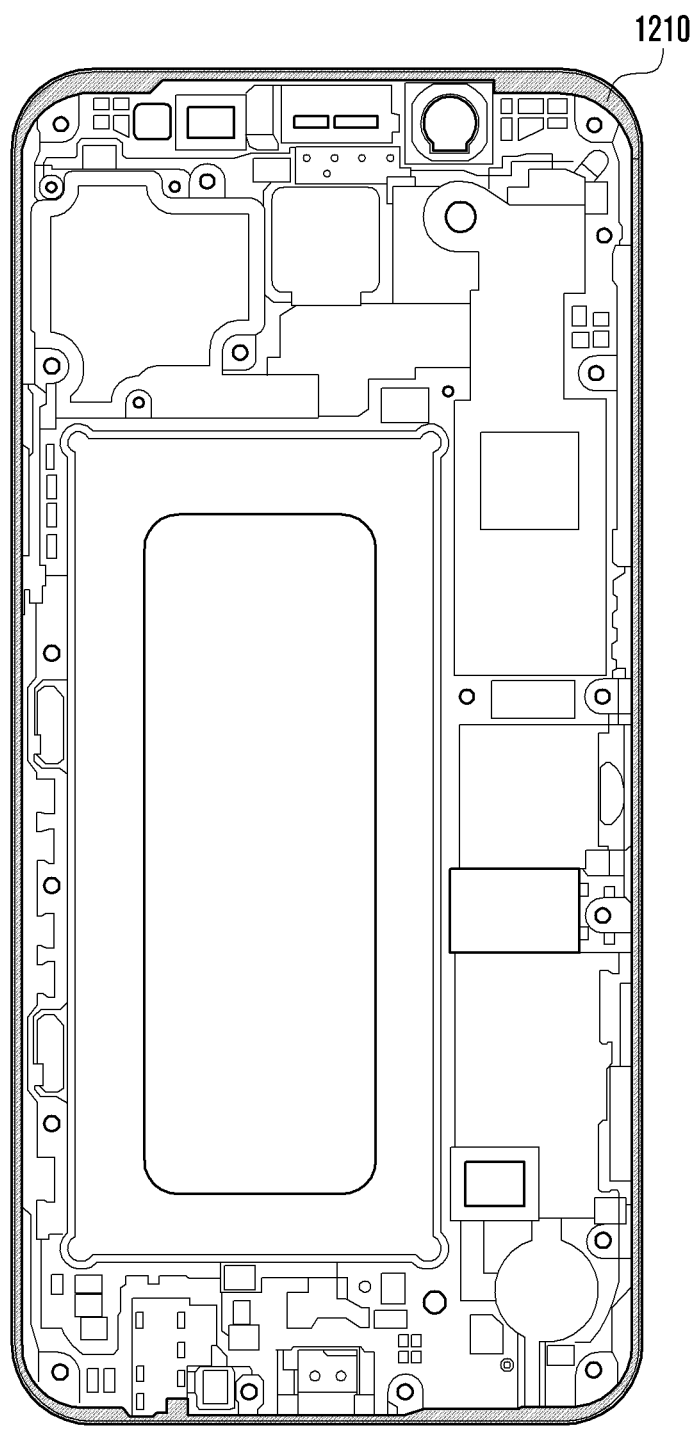
FIG. 12 is a diagram illustrating a position in which an example waterproof member is disposed according to an embodiment of the disclosure.

FIG. 12 is a diagram illustrating a position 1210 in which a waterproof member is disposed according to an embodiment of the disclosure.

Figure 13:
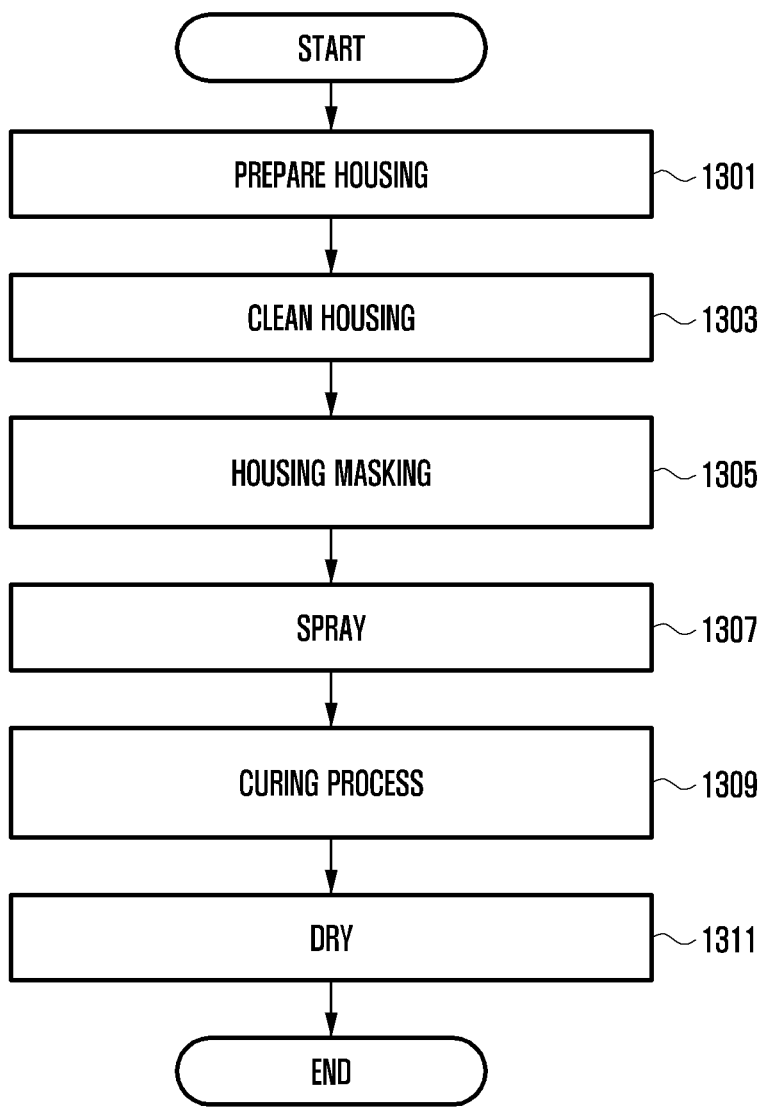
FIG. 13 is a flowchart illustrating an example process in which a waterproof member is applied by a spray method according to an embodiment of the disclosure.

FIG. 13 is a flowchart illustrating an example process of surface treatment of a surface of a portion in which a waterproof member is to be positioned by an example spray coating method according to an embodiment of the disclosure.

A housing of the electronic device to be spray-coated is prepared 1301, a cleaning operation 1303 is performed so that no foreign material remains in the housing, and a masking operation (e.g., jig, tapping, etc.) 1305 is performed, except for a position 1210 in which the waterproof member of FIG. 12 is disposed. A material (e.g., a silicone release agent and a water repellent coating agent) for forming a coating layer in the first portion 516 (see FIG. 6B) to which the waterproof member is to be in contact may be applied 1307 with a spray method and be cured (e.g., thermosetting, ultraviolet curing, wet curing, etc.) 1309. As a curing method, for example, and without limitation, a thermosetting, ultraviolet curing, wet curing, or the like, method may be used. By drying 1311 a material for surface treatment, a coating layer may be finally formed in the first portion 516.

Figure 14:
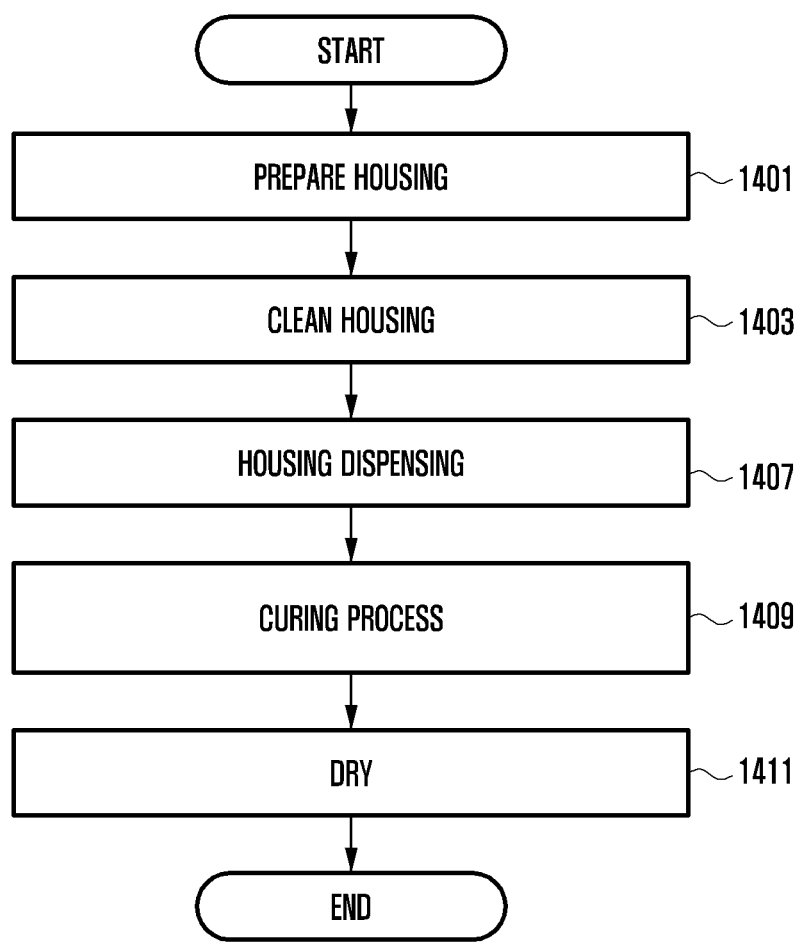
FIG. 14 is a flowchart illustrating an example process in which a waterproof member is applied by a dispensing method according to another embodiment of the disclosure.

FIG. 14 is a flowchart illustrating an example surface treatment of a portion in which a waterproof member is to be positioned by an example dispensing coating method according to another example embodiment of the disclosure.

As illustrated in FIG. 14, the housing of the electronic device to be dispensing-coated is prepared 1401, a cleaning operation 1403 is performed so that no foreign material remains in the housing, and a work for forming a coating layer is performed. A material (e.g., a silicone release agent and a water repellent coating agent) for forming a coating layer in the first portion 516 (see FIG. 6B) with which the waterproof member is to be in contact may be applied and cured 1409 by a dispensing method 1407. As a curing method, for example, and without limitation, a thermosetting, ultraviolet curing, wet curing, or the like, method may be used. By drying 1411 the waterproof member, a coating layer may be finally formed in the first portion 516.

According to an embodiment of the disclosure, in a process of disassembling a rear plate and a mid plate of the electronic device, the waterproof member may be prevented from and/or avoid being separated or damaged together with the mid plate.

An electronic device according to an example embodiment of the disclosure may include a housing including a side member (e.g., a side housing, a side wall, or the like) at least a portion of which includes a metal material; a display disposed in an inner space of the housing to be viewable through at least a portion of the housing; a mid plate disposed in the inner space and at least a portion of which includes a metal material; a waterproof member comprising an adhesive material disposed between a first portion of the mid plate and a second portion of the side member and facing the first portion; and a coating layer disposed between the first portion and the waterproof member.

The coating layer may be disposed on the first portion.

The coating layer may include at least one of a silicone release agent, a fluorine resin, or Teflon.

The waterproof member may include at least one of silicone, urethane, or foam.

The waterproof member may include a first material layer applied along the second portion; and a second material layer having an interfacial adhesion less than an interfacial adhesion of the first material layer and applied to overlap the first material layer.

The electronic device may further include a third material layer positioned between the first material layer and the second material layer and configured to increase a bonding force of the first material layer and the second material layer.

An electronic device according to an example embodiment of the disclosure includes a housing including a front plate facing a first direction, a rear plate facing a second direction opposite the first direction, and a side member comprising a side housing enclosing a space between the front plate and the rear plate; a display disposed in the space and to be viewable through the front plate; a mid plate positioned between the display and the rear plate; and a waterproof member comprising an adhesive material disposed between the first portion of the mid plate and the second portion of the side member and facing the first portion, wherein the waterproof member has a bonding force with the second portion greater than a bonding force with the first portion.

The first portion may be provided along an outer edge of the mid plate, and the second portion may be provided in a portion of the side member in which the mid plate is seated and contacts the side member.

The first portion and the second portion each may form a closed curve.

The waterproof member may be disposed along the second portion.

The waterproof member may include a first material layer applied along the second portion and a second material layer having an interfacial adhesion less than an interfacial adhesion of the first material layer and disposed to overlap the first material layer.

The electronic device may further include a third material layer positioned between the first material layer and the second material layer and configured to increase a bonding force of the first material layer and the second material layer.

The waterproof member may include an adhesive layer attached along the second portion and a second material layer having an interfacial adhesion less than an interfacial adhesion of the adhesive layer and disposed to overlap the adhesive layer.

The second portion of the side member may be plasma treated.

The electronic device may further include a coating layer disposed between the first portion and the waterproof member and disposed on a surface of the first portion facing the second portion.

The coating layer may include at least one of a silicone release agent, a fluorine resin, or Teflon.

The electronic device may further include a fastening portion comprising a fastener positioned inside a closed curve defined by the first portion and the second portion and configured to couple the mid plate 515 and the rear plate 513.

The fastening portion may include a screw.

A groove may be included along the second portion of the side member.

In the second portion of the side member, a latch jaw may be included along an edge of a central direction of the rear plate.

The example embodiments of the disclosure disclosed in this disclosure and drawings only present various example in order to aid in description of the technical contents according to example embodiments of the disclosure and to aid in understanding of the example embodiments of the disclosure, and they do not limit the scope of the disclosure. Accordingly, all changes or modifications derived from the technical idea of various example embodiments of the disclosure in addition to the embodiments described herein should be understood as being included in the scope of the disclosure.

What is claimed is:

1. An electronic device, comprising:
a housing comprising a front plate, a rear plate and a side member enclosing an inner space between the front plate and the rear plate and comprising a metal material;
a display disposed in the inner space of the housing to be viewable through at least a portion of the front plate;
a mid plate disposed in the inner space and comprising a metal material, wherein a portion of the mid plate is disposed below a portion of the side member and is releasably secured to the rear plate, the mid plate comprises an outer edge extending outside of the inner space and above the side member, the mid plate is disposed between the front plate and the side member, and the display is supported by a surface of the mid plate facing the front plate;
a waterproof member disposed between a first portion of the mid plate and a second portion of the side member facing the first portion; and
a coating layer disposed on a surface of the first portion of the mid plate,
wherein the mid plate adhesively is attached to the rear plate through at least the waterproof member, and
wherein the waterproof member has a bonding force with the second portion greater than a bonding force with the first portion through the coating layer.

2. The electronic device of claim 1, wherein the coating layer comprises at least one of a silicone release agent, a fluorine resin, or Teflon.

3. The electronic device of claim 1, wherein the waterproof member comprises at least one of silicone, urethane, or foam.

4. The electronic device of claim 1, wherein the waterproof member comprises:
a first material layer disposed along the second portion; and
a second material layer having an interfacial adhesion less than an interfacial adhesion of the first material layer and is disposed to overlap the first material layer.

5. The electronic device of claim 4, further comprising a third material layer positioned between the first material layer and the second material layer and configured to increase a bonding force of the first material layer and the second material layer.

6. The electronic device of claim 1, wherein the first portion is positioned along an outer edge of the mid plate, and the second portion is positioned in a portion of the side member in which the mid plate is seated.

7. The electronic device of claim 1, wherein the first portion and the second portion each define a closed curve.

8. The electronic device of claim 1, wherein the waterproof member is disposed along the second portion.

9. The electronic device of claim 1, wherein the second portion of the side member is plasma treated.

10. The electronic device of claim 1, further comprising a fastening portion comprising a fastener positioned inside a closed curve defined by the first portion and the second portion and configured to couple the mid plate and the side member.

11. The electronic device of claim 10, wherein the fastener comprises a screw.

12. The electronic device of claim 1, wherein the display is disposed between the mid plate and the front plate.

13. The electronic device of claim 12, wherein the mid plate is attached to the front plate though an adhesive member.

* * * * *